United States Patent [19]
Ishizaka et al.

[11] Patent Number: 4,801,977
[45] Date of Patent: Jan. 31, 1989

[54] PROJECTION OPTICAL APPARATUS

[75] Inventors: Shoji Ishizaka, Kawasaki; Hideo Mizutani, Yokohama; Susumu Makinouchi, Kawasaki; Akikazu Tanimoto, Yokohama, all of Japan

[73] Assignee: Nikon Corporation, Tokyo, Japan

[21] Appl. No.: 198,688

[22] Filed: May 24, 1988

Related U.S. Application Data

[63] Continuation of Ser. No. 089,415, Aug. 26, 1987, abandoned.

[30] Foreign Application Priority Data

Aug. 29, 1986 [JP] Japan ................................ 61-201793

[51] Int. Cl.⁴ ..................... G03B 27/52; G03B 27/74; G03B 27/80
[52] U.S. Cl. ......................................... 355/30; 355/53; 355/68; 356/152
[58] Field of Search ................................. 250/201–205, 250/234, 548, 561; 356/152, 373, 375, 400, 401; 353/101, 122; 355/30, 40, 41, 43, 53, 54, 68

[56] References Cited

U.S. PATENT DOCUMENTS

| 4,391,511 | 7/1983 | Akiyama et al. | 355/40 |
| 4,395,117 | 7/1983 | Suzuki | 355/43 |
| 4,512,657 | 4/1985 | Sakato | 355/68 |
| 4,629,313 | 3/1986 | Tanimoto | 355/53 |
| 4,650,983 | 6/1987 | Suwa | 250/204 |
| 4,666,273 | 12/1987 | Shimizu et al. | 353/101 |
| 4,668,077 | 5/1987 | Tanaka | 355/53 X |
| 4,682,037 | 7/1987 | Kosugi | 356/400 X |
| 4,685,805 | 8/1987 | Kodama et al. | 356/373 |
| 4,687,322 | 7/1987 | Tanimoto et al. | 355/55 |
| 4,699,505 | 10/1987 | Komoriya et al. | 355/53 X |
| 4,711,567 | 12/1987 | Tanimoto | 355/53 |

Primary Examiner—Richard A. Wintercorn
Attorney, Agent, or Firm—Shapiro and Shapiro

[57] ABSTRACT

A projection optical apparatus comprises a projection optical system for projecting the image of an object onto a substrate, data collecting means for obtaining data regarding a factor which causes a variation in the optical characteristic of the projection optical system, adjusting means for adjusting the relation between the substrate and the image of the object relative to the variation in the optical characteristic of the projection optical system, means for determining the amount of adjustment by the adjusting means in accordance with a model formula using a predetermined parameter on the basis of the data obtained by the data collecting means, means for independently measuring the variation in the optical characteristic of the projection optical system, and means for correcting the parameter of the model formula on the basis of the result measured by the measuring means.

10 Claims, 7 Drawing Sheets

PROJECTION OPTICAL APPARATUS

This is a continuation application of Ser. No. 089,415 filed Aug. 26, 1987, now abandoned.

BACKGROUND OF THE INVENTION

1. Field of the Invention

This invention relates to a projection optical apparatus for controlling, in an apparatus provided with a projection optical system, particularly an exposure apparatus for the manufacture of semiconductor elements, the pattern image of a projected mask to a desired projected state irrespective of any variation in the optical characteristic of the projection optical system.

2. Related Background Art

In recent years, exposure apparatuses, particularly reduction projection type exposure apparatuses have become indispensable for the production of integrated circuits. In such an exposure apparatuses is usually made of a projection lens for reduction-projecting a circuit pattern on a reticle onto a semiconductor wafer to 1/5 or 1/10 and obtaining a resolution of 1 μm or more for the line width.

Especially at present, to achieve an improvement in the degree of integration of semiconductor devices, a projection lens which will increase the resolving power while keeping a great projection exposure area has become desired.

Generally, in such an exposure apparatus, a focus detector utilizing a gap sensor which will detect the spacing between a projection lens and a wafer is incorporated to cope with the variation in the thickness of the wafer and the unevenness of the surface of the wafer when a predetermined pattern is formed by the lithography process. Such focus detector is shown, for example, in U.S. Pat. No. 4,650,983. Automatic focusing in which the imaging plane of the projection lens, i.e., the image surface of the projected pattern, is made coincident with the surface of the wafer on the basis of the detection signal of the focus detector is effected.

However, it is known that by the projection lens itself absorbing heat energy or by the environmental temperature and the atmospheric pressure changing, the optical performance of the projection optical system is varied and the best imaging position fluctuates. The fluctuation of the imaging position caused by the variation in the projection lens itself cannot be corrected by only the conventional focus detector which utilizes a gap sensor.

Such fluctuation can be eliminated if use is made of optical focus detecting means through the projection lens, but there are various problems in it. A pattern-like film layer of the order of 1 μm is present on the wafer which is a substrate to be projected, and the pattern-like film layer includes a layer of optically transparent material such as $SiO_2$ and a layer of optically opaque material such as Si or aluminum. Further thereon, there is present a photoresist film of maximum several microns. In addition to such a situation, the use of a printing light in such optical focus detecting means would cause the photoresist on the wafer to be sensitized, and heed must be given to this point. Means using a printing light of nonsensitizing wavelength for the photoresist is also possible, but in such case, the aberrations of the projection lens are bad and image formation of good quality cannot be accomplished.

In addition, such a thermal influence is exerted not only to the fluctuation of the imaging position but also to the magnification of the projection optical system, and this forms a cause that prevents image formation of good representability from being accomplished.

To solve the above-noted problems, a system for automatically modifying the focus detector utilizing a gap sensor correspondingly to any variation in the atmospheric pressure is proposed in U.S. application Ser. No. 826,979 filed on Feb. 7, 1986, abandoned in favor of a continuation application, Ser. No. 931,013 filed on Nov. 17, 1986, now U.S. Pat. No. 4,687,322 granted Aug. 18, 1987, now abandoned.

Further, U.S. Pat. No. 4,666,273 proposes the technique of stabilizing the magnification of the projection optical system for any variation in the physical factors inside or outside the projection optical system, particularly any variation in temperature caused by illuminating energy.

SUMMARY OF THE INVENTION

It is an object of the present invention to provide a projection optical apparatus in which adjustment of the imaging characteristic can always be accomplished satisfactorily.

It is another object of the present invention to provide a projection optical apparatus in which the fluctuation of the optical characteristic of a projection optical system is preestimated by operating a mathematical expression representing a linear model and adjustment of the optical characteristic is accomplished on the basis of the result of the operation.

The optical characteristic after the adjustment by the preestimated value is directly measured by measuring means such as a TTL type FA (focus aid), and correction of the parameter of the linear model is effected when an error is found from the result of the measurement.

In this manner, adjustment of the optical characteristic is effected while correction of the parameter is being effected.

By the present invention, the fluctuation of the focus caused by environmental variations such as any thermal variation resulting from the absorption of light energy into the projection optical system, any variation in the atmospheric pressure and any variation in the temperature of the exposure apparatus in which the projection optical system is mounted, and the fluctuation of the focus caused by the liberation of the strain the apparatus structurally has can be corrected to thereby ensure accurate focusing to be accomplished. Thereby, the control of the line width of the pattern becomes more precise.

DESCRIPTION OF THE PREFERRED EMBODIMENTS

Figure 1:
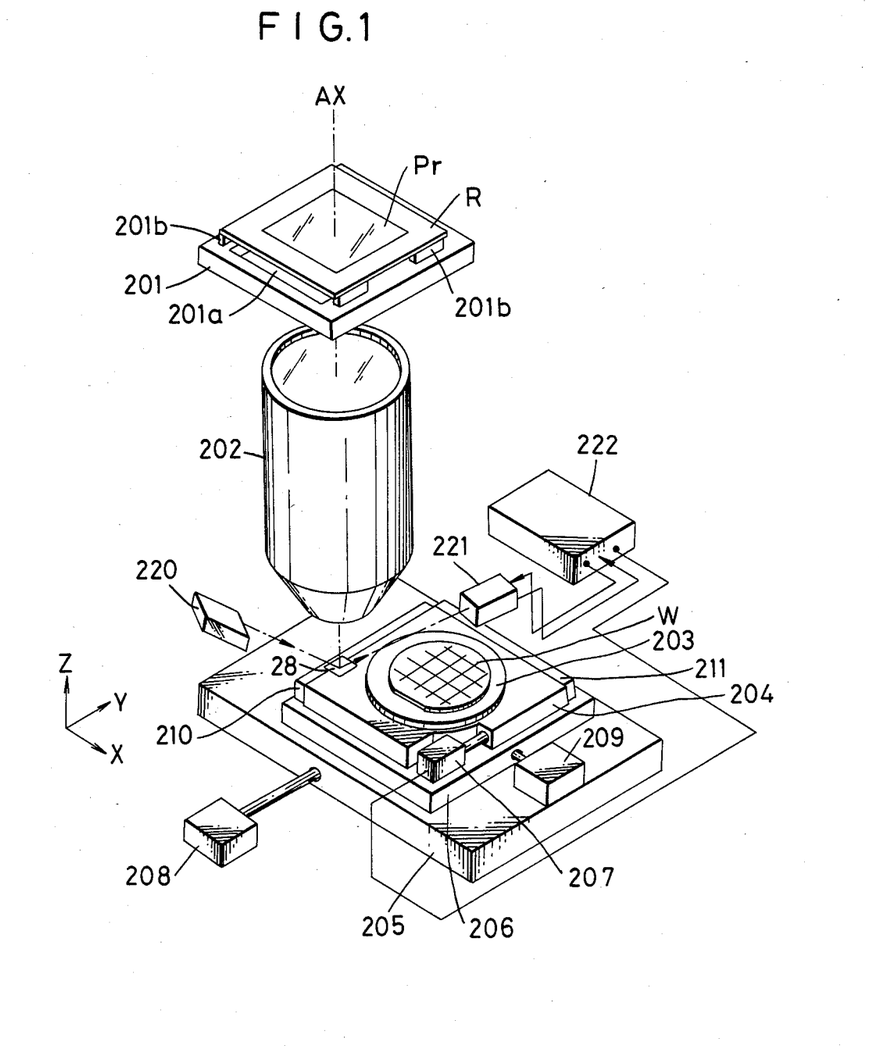
FIG. 1 is a perspective view schematically showing the construction of an exposure apparatus.

In FIG. 1, there is schematically shown the construction of a reduction projection type exposure apparatus, so-called stepper, having a gap sensor as previously described.

A reticle R on which a circuit pattern to be projected is depicted is supported on a reticle stage 201. The reticle stage 201 is formed with an opening 201a through which an illuminating light passed through the pattern region Pr of the reticle R enters a projection lens 202.

The reticle stage 201 is further provided with a plurality of holding portions 201b for vacuum-adsorbing the marginal portion of the reticle R.

The reticle stage 201 is finely moved in x and y directions shown and is positioned so that the center of the reticle R coincides with the optic axis AX of the projection lens 202.

A two-dimensionally movable stage is provided below the projection lens 202. A wafer W is vacuum-adsorbed onto a wafer chuck 203. The wafer chuck 203 is provided on a Z stage 204 movable up and down in the direction of the optic axis AX of the projection lens 202, i.e., Z direction. The Z stage 204 is provided so as to be moved up and down by an actuator 207, on an X stage 206 movable in x direction on a Y stage 205 which is movable in y direction. Actuators 208 and 209 are for one-dimensionally driving the Y stage 205 and the X stage 206, respectively.

Movable mirrors 210 and 211 for a laser interference measuring machine for detecting the coordinates position of the Z stage 204 are provided on the sides of the Z stage 204 which extend in x direction and y direction, respectively.

In the apparatus as described above, when the reticle R is illuminated by illuminating optical means, not shown, the pattern image in the pattern region Pr is formed on the imaging plane of the projection lens 202. As a gap sensor for detecting the positional relation between the imaging plane and the surface of the wafer W, i.e., the spacing between the projection lens 202 and the wafer W, there are provided a projector 220 and a light receiver 221.

Of these, the projector 220 has the function of obliquely projecting a sheet-like beam which will be imaged on the imaging plane of the projection lens 202, and the light receiver 221 has the function of receiving the reflected light of the slit optical image from the wafer W positioned on the imaging plane and detecting the position of the wafer W in Z direction, i.e., the spacing between the projection lens 202 and the wafer W.

The light receiver 221 synchronously rectifies the photoelectric signal of the reflected light from the wafer W, thereby outputting a focus signal representative of the surface position of the wafer W. This focus signal is a synchronously rectified signal and therefore has an s-curve characteristic similar to the output characteristic of a photoelectric microscope or the like, and is input to a control circuit 222 for focusing. The control circuit 222 has the function of outputting a control signal for servo-controlling the actuator 207 for moving the Z stage 204 up and down. By the control thereby, adjustment of the Z stage 204 is effected so that the surface of the wafer is positioned at such a level that the focus signal represents in-focus.

Figure 2:
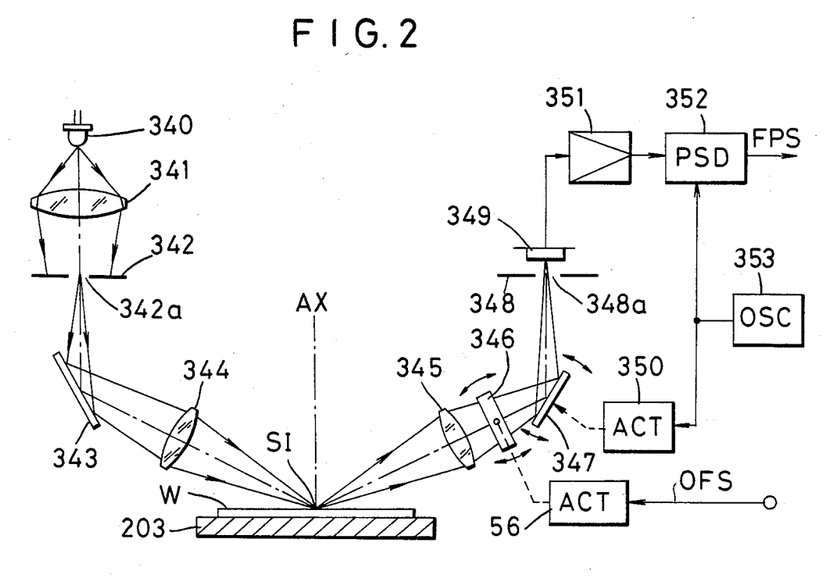
FIG. 2 shows an example of the detailed construction of a gap sensor.

In FIG. 2, there is shown in detail an example of the construction of the gap sensor.

A light-emitting diode 340 outputs as an illuminating light a light having a predetermined wavelength range which does not sensitize the photoresist on the wafer W. This illuminating light is adapted to be condensed by a condenser lens 341 and enter a slit plate 342 having an elongated rectangular slit 342a. The sheet-like beam transmitted through the slit 342a is reflected by a mirror 343 and also converged by an imaging lens 344.

Also, the converged illuminating light enters that portion of the surface of the wafer W which is in the vicinity of the optic axis AX of the projection lens 202, whereby the optical image SI of the slit 242a is formed.

The above-described elements 340, 341, 342, 343 and 344 together constitute the projector 220 of FIG. 1.

The reflected light from the wafer W may be directed to a slit plate 348 through an imaging lens 345, plane parallel glass 346 and a vibratory mirror 347. That is, design is made such that on the slit plate 348, the enlarged image of the above-mentioned optical image SI is formed parallel to the slit.

The slit plate 348 is provided with a slit 348a, and the light transmitted through this slit 348a may be received by a photoelectric detector 349.

The above-described elements 345, 346, 347, 348 and 349 together constitute the light receiver 221 of FIG. 1.

The vibratory mirror 347 is driven by a driving unit 350 so that the enlarged image of the optical image SI makes a simple harmonic motion in a direction orthogonal to the slit on the slit plate 348.

The photoelectric signal from the photoelectric detector 349 is amplified by an amplifier 351, whereafter it is input to a synchronously rectifying (synchronously detecting) circuit (hereinafter referred to as "PSD") 352. This PSD 352 has the function of receiving as an input the reference frequency signal from an oscillator 353 which determines the vibration frequency of the vibratory mirror 347, synchronously rectifying the photoelectric signal by that signal and thereby outputting a focus signal FPS.

The above-described elements 350, 351, 352 and 353 together constitute the control circuit 222 of FIG. 1.

The driving unit 56 will be described later.

Now, the position in Z direction detected as the in-focus position by the gap sensor as described above is mechanically determined during the manufacture of the apparatus so as to be a predetermined distance from the projection lens 202 and therefore, when a focus fluctuation is caused by a variation in the temperature of the projection lens 202, the surface of the wafer W becomes deviated from the imaging plane even if said position is adjusted to the in-focus state by the focus signal FPS.

Particularly, to obtain a higher resolution, the numerical aperture (N.A.) of the projection lens must be made greater, but it will necessarily lead to a shallow depth of focus.

The depth of focus for obtaining predetermined pattern line width accuracy is smaller as the projected minimum pattern is smaller, and it is a depth of focus of the order of ±1 μm when a line-and-space pattern of 1 μm is projected.

Figure 3:
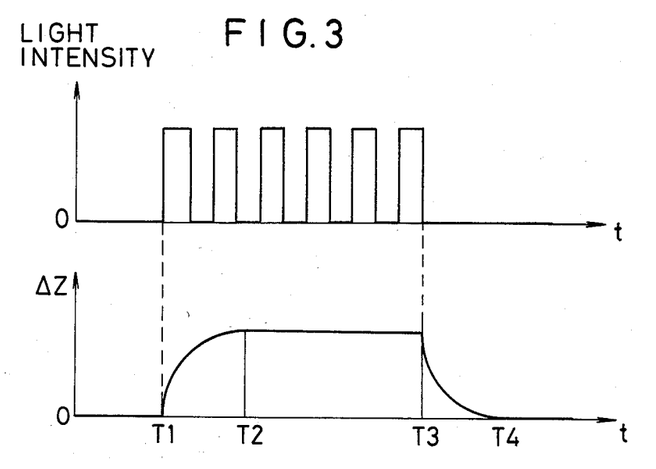
FIG. 3 is a graph showing the variation in the optical characteristic of a projection lens caused by the incidence of an illuminating light.

FIG. 3 shows the relation between the intensity of printing light supplied to the projection optical system and the displacement of the imaging position (or the displacement of the magnification) of the projection optical system, $\Delta Z$.

In FIG. 3, application of the printing light is periodically repeated between time $T_1$ and time $T_3$. The fluctuation $\Delta Z$ of the imaging position of the projection lens caused by the influence of the printing light occurs from time $T_1$ and is saturated at time $T_2$. Thereafter, said fluctuation again occurs from time $T_3$ when the printing is terminated, and restores its initial state at time $T_4$.

Figure 5:
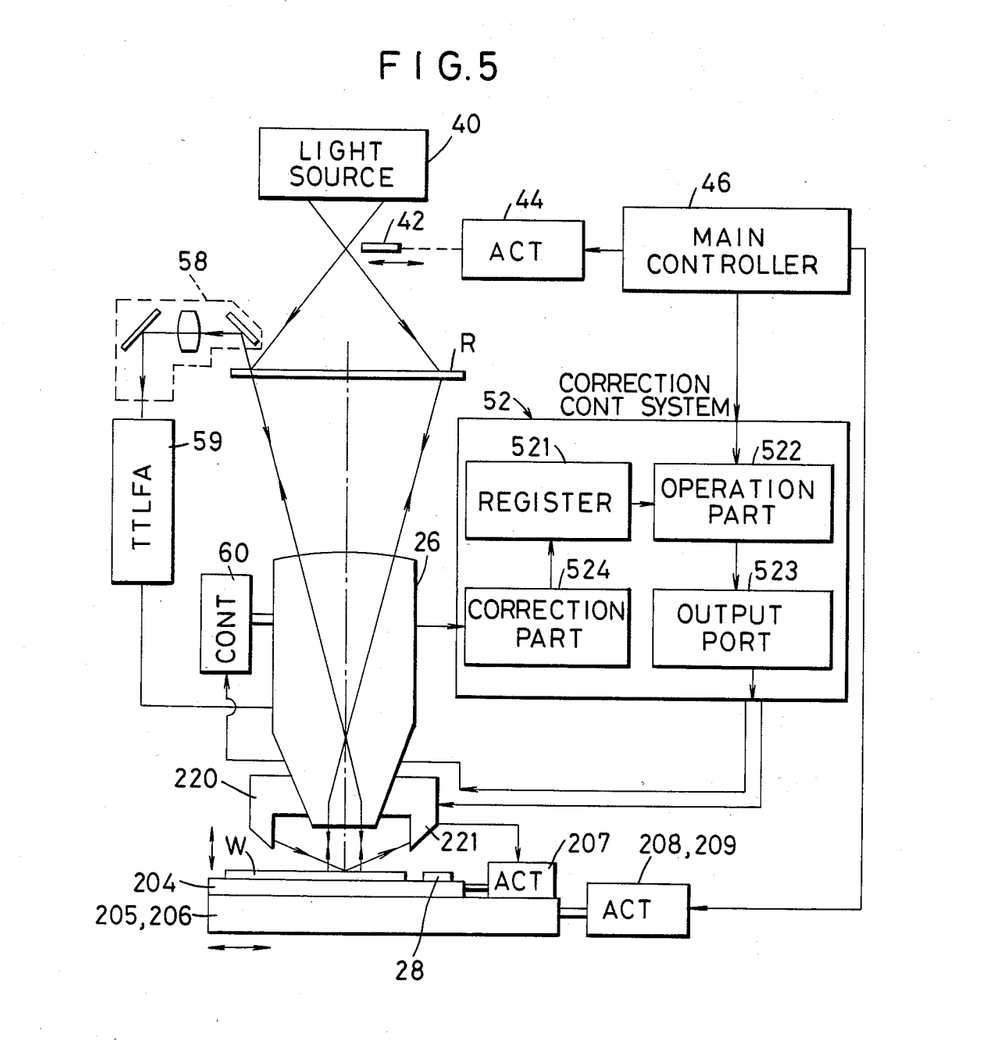
FIG. 5 shows the construction of an embodiment of the present invention.

FIG. 5 shows a projection exposure apparatus according to an embodiment of the present invention. First, to make the present embodiment more readily understood, the epitome thereof will hereinafter be described.

Figure 4:
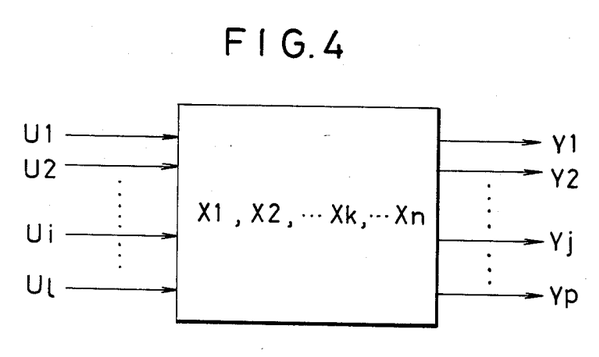
FIG. 4 illustrates a popular system.

Generally, the system is comprised of a combination of a number of components and may be expressed as shown, for example, in FIG. 4. That is, $U_i$ is an input variable, $Y_j$ is an output variable and $X_k$ is a state variable. These variables generally vary with the lapse of time and therefore are functions of time t.

Expressing a linear system by the use of these variables, it may be expressed by a state equation assuming a recurrence formula and an output equation deriving a physical amount corresponding to a fluctuation value.

The present invention deals with a case where the focus and magnification fluctuations of the projection optical system are caused by environmental variations such as variations in the incidence of the illuminating light, the temperature of the open air and the external pressure. Accordingly, the variations in the incidence of the illuminating light and environmental conditions correspond to the aforementioned input variable $U_i$, and the focus and magnification fluctuations correspond to the output variable $Y_j$. Also, the variations in the characteristics of the individual elements constituting the projection optical system correspond to the state variable $X_k$.

The outline of focus correction will now be described. First, the temperature rise due to the illuminating light depends on the quantity of illuminating light passed through the projection lens. This quantity of illuminating light is the product of the intensity of the illuminating light passed through the projection lens and the opening-closing duty ratio of the shutter which controls the exposure. Of these, the intensity of the illuminating light is measured at the early stage of a series of exposing works as during the interchange of the reticle by the use of an illumination sensor (SPD) lying on the stage.

On the other hand, the opening-closing duty ratio of the shutter is found by monitoring, for example, the opening-closing of the shutter for 5 seconds and finding the average value of the duty ratio in the meantime (the shutter opening time within 5 seconds/5 seconds).

On the basis of the information regarding the quantity of illuminating light found in the described manner, a correction control system 52 shown in FIG. 5 indirectly finds the amounts of fluctuation of the focus and magnification on the basis of the aforementioned state equation and output equation. On the basis of these amounts of fluctuation, offset is applied to the gap sensor.

Magnification correction is also accomplished by a basically similar operation, but the correction value is input to a pressure controller 60 for varying the air pressure in the lens chamber of the projection lens, whereby control is accomplished. When the air pressure is changed, the refractive index of the air varies and therefore, the magnification of the projection lens 26 itself varies.

Control of the focus and magnification fluctuations is accomplished by the above-described method. As described above, the focus and magnification of the projection lens are varied by a variation in the atmospheric pressure, and the correction therefor is also effected. The influence of the atmospheric pressure is corrected by the use of an atmospheric pressure sensor.

Subsequently, the state of the focus after the above-described correction is detected by a focus detecting mechanism (hereinafter referred to as "TTLFA") 58, 59 as direct fluctuation measuring means shown in FIGS. 6 and 7.

When it is recognized by the TTLFA that the projection lens is not in good in-focus state, a command to that effect is sent to the correction control system 52 and modification of the parameters of the state equation and output equation is effected. The amount of fluctuation of the focus is again found by the equations after said modification, and predetermined correction is effected.

As described above, the state after the correction is examined by the TTLFA after the fluctuation correction has been effected by the correction control system, and this is because there is a case where the fluctuation correction cannot always be well accomplished by only one of them. Thus, control is effected with the state in which the fluctuation correction has been effected in the two being regarded as a state in which matching has been kept best.

Figure 6:
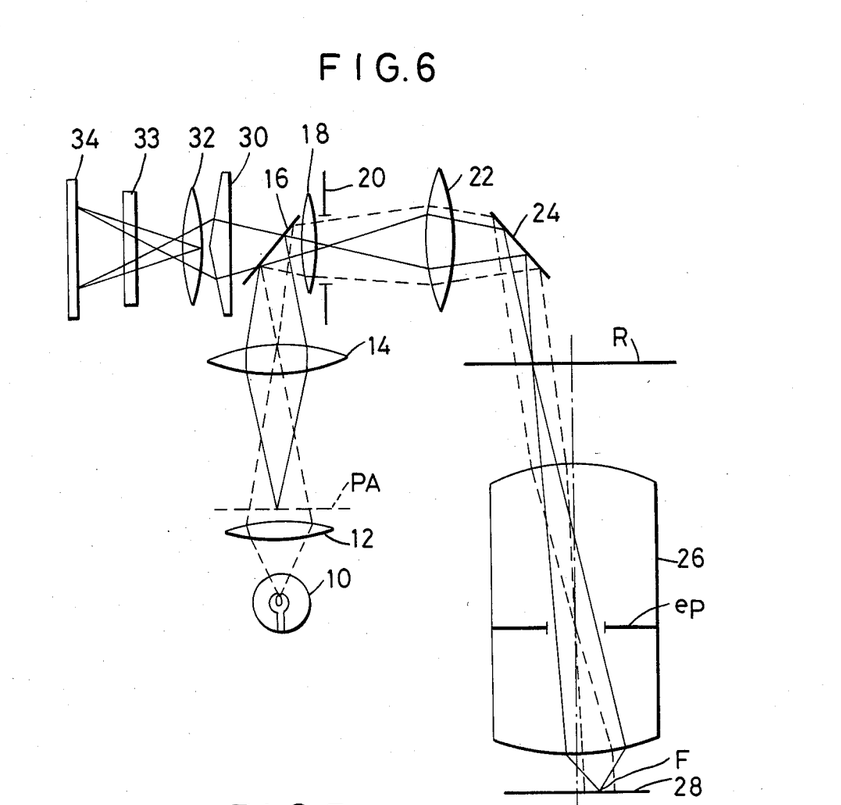
FIG. 6 shows the construction of TTLFA.

Reference is now had to FIG. 6 to describe the focus detecting mechanism for effecting focus detection through the projection optical system. FIG. 6 shows a state in which the pattern of the reticle R is imaged at a point F. Since a reflecting plate 28 is disposed instead of a wafer, any consideration for photoresist sensitization is not necessary and an illuminating light of a sensitization wavelength which is the best wavelength with respect to the chromatic aberration of the projection lens can be used in a sufficient quantity of light.

The illuminating light (of the same wavelength as the exposure light) output from a light source 10 illuminates a line-and-space-like (grating-like) pattern PA through a relay lens 12, and the light transmitted therethrough enters a half-mirror 16 through a lens 14. The illuminating light reflected by the half-mirror 16 passes through a field lens 18, a field stop 20 and a relay lens 22 to a mirror 24, whereby it is reflected and enters the reticle R.

Subsequently, the illuminating light transmitted through the reticle R passes through a projection lens 26 to a reflecting plate 28, whereby it is reflected. The reflected light by the reflecting plate 28 passes through the projection lens 26 and the reticle R to the mirror 24, whereby it is reflected and is transmitted through the relay lens 22, the field stop 20, the field lens 18 and the half-mirror 16. The reflected light divided by a dividing prism 30 provided at a position conjugate with the pupil of the projection lens 26 is transmitted through a relay lens 32 and a cylindrical lens 33, and divided images of the pupil are formed at different portions on a linear array sensor 34.

Figure 7:
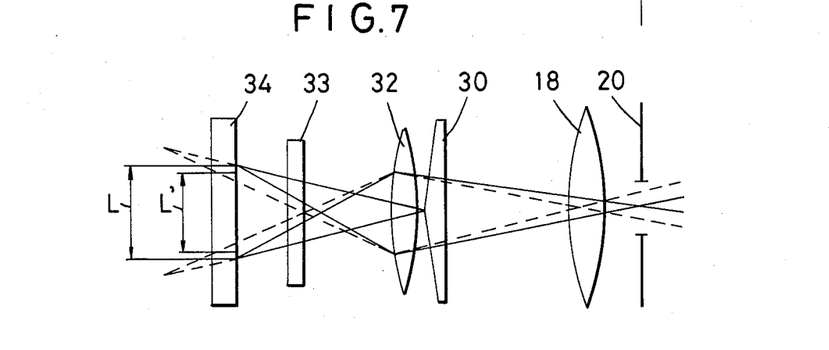
FIG. 7 shows the constructions of the essential portions of the TTLFA.

In FIG. 7, there are enlargedly shown the above-described array sensor 34, cylindrical lens 33, relay lens 32, dividing prism 30, field lens 18 and field stop 20. The bus line of the cylindrical lens 33 is coincident with the direction of arrangement of the light-receiving elements of the array sensor 34. This cylindrical lens 33 has the function of compressing the line direction of the reflected image of the pattern PA and increasing and averaging the quantity of light.

Some optical elements of the TTLFA constitute a portion 58 of the alignment optical system as shown in FIG. 5, and the TTLFA system 59 is constituted by the other portion. Also, in FIG. 6, the broken lines represent the imaging light ray (principal ray) of the illuminating light from the light source 10, and the solid lines represent the principal ray of the light beam imaged on the reticle R, the reflecting plate 28, etc.

In the apparatus as described above, the angle formed by and between the light beams imaged at the point F is $\pm\theta_1$ if the numerical aperture N.A. is $\sin\theta_1$. In this example, a light beam of $2\theta_1$ is divided into two on a plane containing the optic axis by the dividing prism 30, and the focus is detected by the use of the nature of the thus divided light beams.

A grating-like pattern PA is disposed at a position between the condenser lens 12 and the relay lens 14 and conjugate with the reticle R and the reflecting plate 28, and the pattern PA is illuminated by the light source 10 and is projected onto the reflecting plate 28. The pattern image reflected by the reflecting plate 28 is divided into two by the dividing prism 30 lying at a position conjugate with the aperture stop (pupil) eP of the projection lens 26.

As is well known, the divided light beams cause lateral deviation from each other correspondingly to the deviation of the image in the direction of the optic axis. Accordingly, by measuring the spacing between the two divided images on the array sensor 34, detection of the in-focus state can be accomplished. That is, assuming that the spacing between the two images is L during the in-focus as shown by solid lines in FIG. 7, the spacing becomes L' narrower than L as indicated by dotted lines when the images deviate in one direction from the in-focus state, and becomes wider than the image spacing L when the images deviate in the other direction from the in-focus state.

To extract the lateral displacement of these images accurately, there is a method of Fourier-converting, for example, the image on the array sensor 34, extracting the phase portion thereof and finding the lateral deviation by the transition theorem of the Fourier conversion.

First, the intensity of the optical image on the array sensor 34 is expressed as a function f(x) of the position x in the direction of arrangement of the elements of the sensor 34, i.e., the direction perpendicular to the optic axis. Then, the Fourier conversion $F_1$ of the intensity f(x) before said optical image is displaced can be expressed as shown in equation (1) below with the spatial frequency as S.

$$F_1(S) = \int_{-\infty}^{\infty} f(x)e^{-2\pi i x s} dx \quad (1)$$

Next, the Fourier conversion when said optical image has been displaced laterally by a is as shown in equation (2) below from the transition theorem.

$$F_2(S) = e^{-2\pi i a s} F_1(S) \quad (2)$$

Comparing the above equations (1) and (2), the magnitude of the Fourier component is not changed by the displacement a, but only the phase thereof deviates by $2\pi as$ and therefore, if the phase of the deviation is $\Delta\theta$, the displacement a may be expressed as shown in equation (3) below.

$$a = \frac{\Delta\theta}{2\pi s} \quad (3)$$

Now, actually, the integration section cannot be taken infinitely. Thus, integration is effected with respect to a section of suitable sample length l on the array sensor 34.

The correction control system for finding the amount of fluctuation of the focus on the basis of the above-mentioned state equation, etc. will now be described with reference to FIG. 5.

The illuminating light output from a light source 40 may pass through a shutter 42, the reticle R and the projection lens 26 to the wafer W.

The shutter 42 is driven by an actuator 44 which is controlled by a main control system 46. The main control system 46 controls actuators 208 and 209 for driving the X and Y stages, and the correction control system 52. This correction control system 52 is constituted by a register 521 for recording parameters, an operation part 522, an output part 523 producing a correction value, and a correction part 524.

The information regarding the ON-OFF of the shutter 42 from the main control system 46 and the information from the register 521 in which the parameters corrected by the correction part 524 are recorded are input to the operation part 522. The output of the operation part 522 is effected relative to the output part 523, from which a correction value is produced to the light receiver 221 or the pressure controller 60. Specifically, the correction value is input to the driving part 56 for pivotally moving the plane parallel glass 346 shown in FIG. 2, and offset is applied during the focus detection of the oblique incidence type.

Describing in detail, the aforementioned plane parallel glass 346 is disposed in the condensing system behind an enlarging lens 345, and is designed so as to be capable of being inclined within a predetermined range of angle by the driving part 56. If the degree of inclination of this plane parallel glass 346 changes, the center of vibration of the enlarged image of the optical image SI formed on the slit plate 348 shifts in a direction orthogonal to the lengthwise direction of the slit 348a. This shift of the center of vibration relative to the slit 348a is equivalent to the shift in the Z direction of the position of the wafer W when the focus signal FPS is judged as being in the in-focus position, i.e., in the zero-point position on the S curve characteristic waveform. In the present embodiment, correction for the focus fluctuation is effected by the plane parallel glass 346 and the driving part 56.

The reflected light from the wafer W or the reflecting plate 28 on the Z stage 204 passes through the projection lens 26 and the reticle R to the alignment optical system 58, is taken out of a portion of this alignment optical system 58 and enters the TTLFA system 59 described in connection with FIG. 6. The focus deviation information detected by the TTLFA system 59 is input to the correction part 524 of the above-described correction control system 52.

Further, in accordance with the output of the output part 523, the pressure controller 60 effects the correction for the fluctuation of the magnification of the projection lens 26.

In this embodiment, the reflected light from the reflecting plate 28 is introduced into the TTLFA system 59 through a portion 58 of the alignment optical system which is provided above the reticle R, whereas any method may be adopted if it can detect the reflected light through the projection lens 26, and design may be made such that the reflected light is directed by other optical means, for example, an alignment system (LSA system) which supplies non-sensitizing laser light to the wafer W without the intermediary of the reticle.

Of the above-described various parts, the shutter actuator 44 effects the opening-closing drive of the shutter 42 by a command from the main control system 46. The shutter opening-closing information is input from the main control system 46 to the operation part 522 and is utilized as the data for finding the quantity of illuminating light. The intensity of the illuminating light is varied by the transmission factor of the reticle and the intensity of lamp light and therefore is detected by a photoelectric element (not shown) provided on the wafer stage, and the detected information by this photoelectric element is input to the operation part 522 as the data for obtaining the quantity of illuminating light. This photoelectric element is not always necessary in the present invention.

The operation part 522 finds the fluctuation values of the focus and magnification by solving the state equation and output equation (hereinafter generally referred to as the "model formula") by the utilization of the information regarding the input quantity of illuminating light and the parameters stored in the register 521. The parameters in the register 521 are corrected by the correction part 524, as will be described later.

The output part 523 outputs to the light receiver 54 and the pressure controller 60 the specific correction value based on the amount of fluctuation output from the operation part 522.

Description will now be made of the model formula for the projection optical system used in the operation part 522, i.e., the state equation and the output equation.

The projection lens 26 changes its temperature every moment by the passage of the illuminating light therethrough. Therefore, the variables "U, Y, Xi" should all be expressed as a function of time, but here, time is dispersively considered to be "U(K), Y(K), Xi(K)", where K=0, 1, 2, . . . .

That is, in the present embodiment, the duty of the time for which the shutter is opened at an interval of five seconds is measured as described above and therefore, instead of time, dispersed K is used.

With regard to the above-mentioned K, the equation for the projection lens 26 may be expressed two-dimensionally as follows:

$$\begin{bmatrix} X_1(K+1) \\ X_2(K+1) \end{bmatrix} = \begin{bmatrix} \alpha & 0 \\ 0 & \beta \end{bmatrix} \begin{bmatrix} X_1(K) \\ X_2(K) \end{bmatrix} + L \cdot U(K) \quad (4)$$

$$Y(K) = m[a, b] \begin{bmatrix} X_1(K) \\ X_2(K) \end{bmatrix} \quad (5)$$

In these equations (4) and (5), the input variable U(K) is the quantity of illuminating light passed through the projection lens 26 during five seconds, i.e., the amount of energy, and is represented by the product of the duty ratio of the shutter opening-closing and the intensity of the applied light, as described above. The output variable Y(K) is the focus to be found, or the amount of fluctuation of the magnification. In this case, the state variables $X_1(K)$, $X_2(K)$, $X_1(K+1)$ and $X_2(K+1)$ do not correspond to the specific physical amount. In the present embodiment, the new focus and the amount of variation Y(K) in the magnification are calculated every five seconds and therefore, the state variables after five seconds are $X_1(K+1)$ and $X_2(K+1)$, relative to $X_1(K)$ and $X_2(K)$. $\alpha$, $\beta$, a, b, m and L are parameters determined so as to represent the fluctuation characteristic of the projection lens 26 which is shown in FIG. 3. Of these parameters, the parameters $\alpha$ and $\beta$ correspond to the time constant in the variation characteristic inherent to the projection lens 26, the parameters a and b correspond to the coefficient term in said characteristic, and the parameter m is an inherent constant determined for each projection lens in view of the fact that even for the same quantity of illuminating light, said characteristic differs delicately from one projection lens to another. Also, L corresponds to the intensity of lamp light.

Description will now be made of a specific method of finding the above-described parameters $\alpha$, $\beta$, a, b and m. These parameters can be measured as by effecting false exposure operation before the actual exposure operation, and can be measured during the exposure operation or by the use of the aforementioned TTLFA or the like during said operation.

In the present embodiment, $\alpha$, $\beta$, a, b and m are predetermined by an experiment, and a method of presuming "L" by the use of the result of the measurement by the TTLFA as described later will now be described.

$\alpha$, $\beta$, a, b and m are predetermined in the following manner.

First, the reflecting plate 28 is placed just beneath the projection lens 26, and the spacing between the projection lens 26 and the reflecting plate 28 is kept constant by the gap sensor. When the illuminating light is then passed through the projection lens 26, a variation in the output of the TTLFA is obtained as shown in FIG. 3.

The rising curve of the amount of variation $\Delta Z$ of FIG. 3 is expressed by the sum of exponential functions, for example, by $$\Delta Z(t) = \Delta Z_0 (1 - Ae^{-t/T_1} - Be^{-t/T_2}). \quad (6)$$

In this equation (6), $1/T_1$ and $1/T_2$ correspond to the parameters $\alpha$ and $\beta$, respectively, and A and B correspond to the parameters a and b, respectively.

The above-mentioned parameters are found with respect to those regarding the focus fluctuation and those regarding the magnification fluctuation, respectively. These parameters are stored in the register 521 and are utilized for the operation of the model formula of equations (4) and (5) by the operation part 522.

Figure 8:
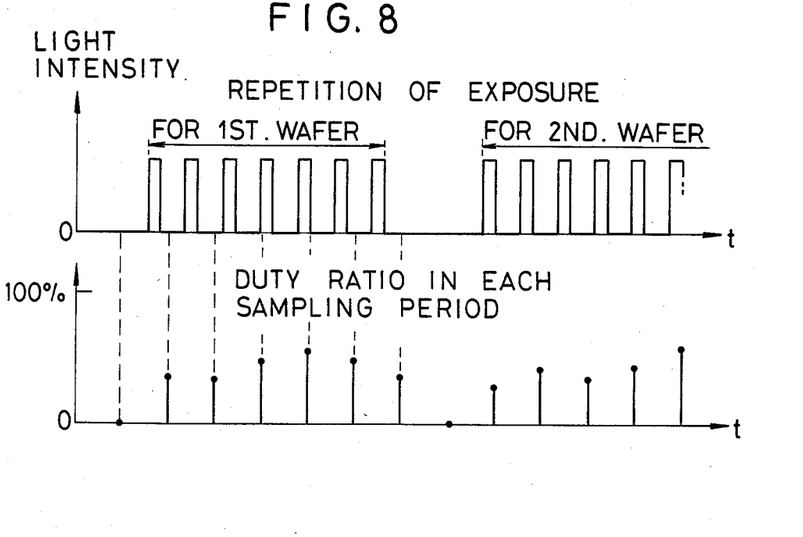
FIG. 8 is a graph illustrating the introduction of information regarding the quantity of incident light.

The general operation of the above-described embodiment will now be described. Description will first be made of the introduction of the information regarding the quantity of illuminating light in the operation part 522 of the correction control system 52. Exposure is periodically effected at a predetermined interval as shown in FIG. 8, in the case of the step-and-repeat system. The quantity of illuminating light is output from the main control system 46 to the operation part 522, at each sampling cycle of five seconds, as the time rate, i.e., the duty ratio, of the illuminating light transmitted through the projection lens 26 during five seconds. This rate corresponds to the rate of the opening time of the shutter 42 in one cycle.

The duty ratio detected at a certain point of time is the value until five seconds before that detection point of time, and the value before that is not detected at all. It is because the projection optical system is assumed to be a linear system that the influence of the past is thus not taken into account. Also, the intensity of the illuminating light is detected by an illumination sensor (not shown) provided on the stage, as described above, and is input to the operation part 522.

Figure 9:
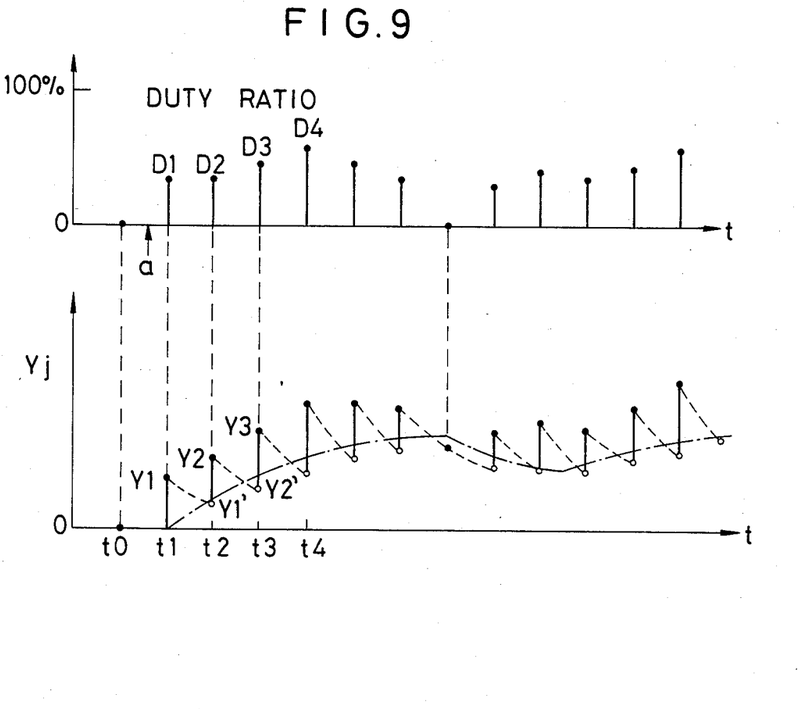
FIGS. 9 and 10 are graphs illustrating the operations of the amounts of fluctuation.

Correction of the fluctuation will now be specifically described with reference to FIG. 9. In FIG. 9, there are shown the above-described duty ratio and the operated value (the preestimated value) Yj of the fluctuation.

First, at time $t=t_0$, exposure is not yet started. Therefore, both of the input variables $X_1$ and $X_2$ of equation (5) are 0 and the operated value Yj of the fluctuation is 0. At time $t=t_1$ after the point of time a at which exposure has been started, the duty ratio becomes $DT=D_1$ and the operation by equations (4) and (5) is performed and thus, $Y=Y_1$ and further, the value $Y_1'$ after five seconds is preestimated.

Subsequently, at time $t=t_2$, exposure is further continued and the duty ratio becomes $DT=D_2$, and the operation by equations (4) and (5) is performed, whereby the sum $Y_2$ of $Y_l$ and the value $Y_1'$ after said five seconds is found, and the value $Y_2'$ after further five seconds is found.

As described above, the amount of fluctuation Yj is repetitively operated every five seconds. Thus, the operation of the amount of fluctuation Yj is performed on the basis of only the operated value before five seconds, and the operated value before that is not taken into consideration.

These amounts of fluctuation are operated with respect to those regarding the focus and those regarding the magnification, respectively.

The amount of fluctuation operated by the operation part 522 in the above-described manner is output to the output part 523. In the output part 523, the specific degree of inclination of the plane parallel glass 346 and the pressure control value in the lens chamber of the projection lens 26 are found on the basis of the input amount of fluctuation, and a command is sent to the light receiver 54 and the pressure controller 60.

At this time, fluctuation of the focus is also caused by the pressure control. Therefore, the output part 523 determines the degree of inclination of the plane parallel glass 346 with the fluctuation of the focus by the pressure control taken into account, and on the basis thereof, the offset by the driving part 56 (see FIG. 2) is applied. Thus, ideally, the fluctuation of the focus and the fluctuation of the magnification are both corrected so as to be zero, but when some degree of time elapses due to the setting error of the parameters in the operation equation or the cumulative error resulting from the repetitive operation, an error occurs between the calculated preestimated amount of fluctuation and the actual amount of fluctuation (the characteristic indicated by dot-and-dash line in FIG. 9), and this error is not always corrected well.

So, in the present invention, the parameters of equations (4) and (5) are corrected by the utilization of the TTLFA of FIG. 6. The correcting method will hereinafter be described.

The check-up by the TTLFA is effected at each exposure of the wafer or at each lot processing of the wafer. First, focusing is effected to the reflecting plate 28 on the stage by the gap sensor. Subsequently, focus deviation is detected relative to the reflecting plate 28 by the use of the TTLFA while this state remains maintained. When this amount of deviation is above the allowed value, correction of the parameters is effected by the correction part 524.

Here, description will be made of a case where the parameter L of equation (4) is corrected. This correction is accomplished by the following equation:

$$L_i = L_{i-1} + G(Y_i - Y) \quad (7)$$

where G is what is called the adaptation gain, and is determined so that the sequence Li converges. Yi is the result of the measurement by the first TTLFA, and Y is the operated value by equations (4) and (5) at the point of time of measurement, as described above.

The above-described correction of the parameter is effected by the correction part 524, and the corrected parameter is input from the register 521 to the operation part 522 and the operation of equations (4) and (5) by a new parameter is effected.

Design may be made such that the other parameters a, b and m than L are corrected.

The check-up by the TTLFA is effected in the above-described manner so that the parameters are successively driven into proper values. Accordingly, the interval of the check-up by the TTLFA can be gradually made longer.

Description will now be made of another method of introducing the information regarding the quantity of illuminating light.

Figure 10:
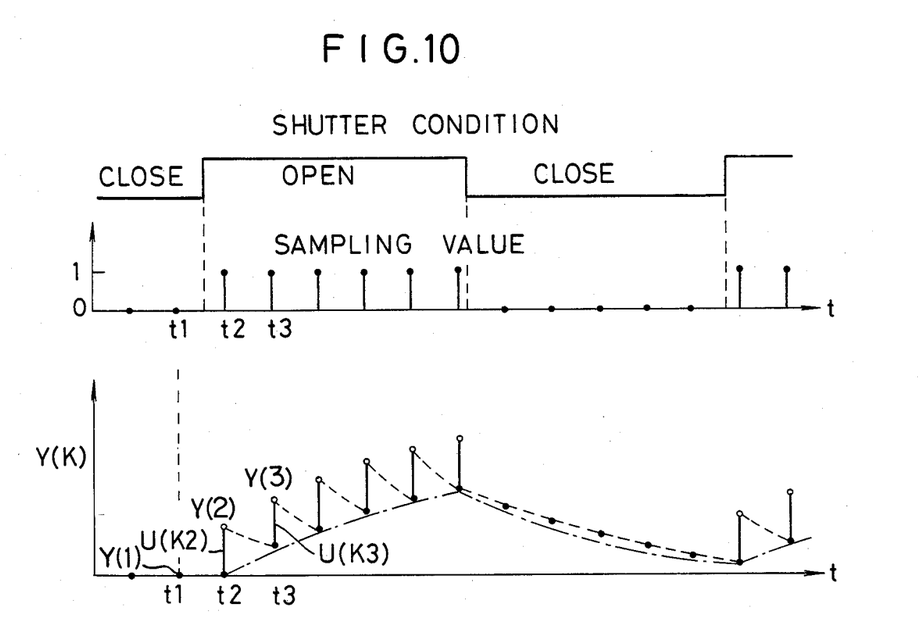

In this method, for example, relative to the opening time 200 mS of the shutter 42, the opening-closing condition of the shutter 42 is input from the main control system 46 to the operation part 522 every 1 mS. Specifically, the opening-closing condition of the shutter 42 shown in FIG. 10 is sampled every 1 mS and is input to the operation part 522.

Subsequently, the amount of fluctuation Y(K) is found by equations (4) and (5). First, at time $t_1$, the shutter is closed and therefore, exposure is not being effected. Therefore, the amount of fluctuation Y(1) is 0.

At time $t=t_2$, the shutter is opened and exposure is being effected. Thus, the sampling value is "1" which is a logic value, and the amount of fluctuation Y(2) is found from $U(K_2)$ obtained by multiplying "1" by L.

Subsequently, at time $t=t_3$, the amount of fluctuation Y(3) is likewise found on the basis of the quantity of incident light $U(K_3)$ By the amount of fluctuation found with the above-described operation being repeated, the offset to the gap sensor is applied. This offset may be applied every 1 mS, or every five seconds as the above-described method.

In the above-described method, however, the frequency of the operation is great and an error in correction may occur due to the setting error or the like of the parameters.

So, the position of the actual imaging plane is sometimes checked up by the TTLFA and on the basis of the result thereof, the correction of the parameters of equations (4) and (5) is effected by the correction part 524 so as to reduce the occurrence of the error.

Further, in some cases, it is also considered that the initial value of the state variable xk is inaccurate. In such cases, presumption is made by a so-called observer. The observer is constructed so that $$\hat{x}k = xk + f(Ye - y). \quad (8)$$

Thus, $\hat{x}k$ is corrected to $xk$ by the use of the result Ye of the measurement by the TTLFA. f is a constant called the observer gain. By this corrected state variable $\hat{x}k$, the subsequent operation of equations (4) and (5) is performed.

Specifically describing, the actually measured value Ye of the fluctuation of the focus is measured by the use of the TTLFA. The interval thereof is an interval at which the value of the state variable xk is renewed n times. That is, the values of $Ye(K_0)$, $Ye(K_0+n)$, $Ye(K_0+2n)$, ... become known by the TTLFA.

Next, the average value $\overline{U}$ of the parameters between $K=K_0$ and $K=K_0+n$ is found by solving equation (4) from $Ye(K_0)$ and $Y(K_0+n)$. Subsequently, by the use of this $\overline{U}$, the presumed values $\hat{X}$ and $\hat{Y}$ of the state variable X between $K=K_0+n$ and $K=K_0+2n$ and the output variable Y are successively found by the following recurrence formulas:

$$\hat{X}(K_0 + n + 1) = \begin{pmatrix} \alpha 0 \\ 0 \beta \end{pmatrix} \cdot (K + K_0 + n) + \overline{U} \quad (9)$$

$$Y(K) = (a, b) \hat{X}(K) \quad (10)$$

This $\hat{Y}(K)$ corresponds to the presumed value Yj' of the fluctuation of the focus.

In the above-described method, the measurement interval of the TTLFA need not always be a predetermined value. For example, the measurement may be effected during each exposure of a wafer W, and when the fluctuation of the focus is great, the measurement may be effected frequently, and when the fluctuation of the focus is small, the measurement may be effected at great intervals.

In the above-described embodiment, description has been made with attention paid to the variation in temperature caused by the illuminating light, but even when the optical characteristic of the projection lens has been varied by environmental variations such as a variation in atmospheric pressure and a variation in external temperature, and a variation in the value $\sigma$ of the illuminating optical system for exposure, it can be corrected in the same manner. Particularly, the parameter correction by the TTLFA is effective.

Also, in the above-described embodiment, both of the focus and magnification of the projection lens have been corrected, but only one of them may be corrected.

Also, a reference mark provided at a portion of the reflecting plate 28 is detected by the use of the TTL type alignment system 58, whereby the fluctuation of the magnification of the projection lens can be actually measured. For this purpose, a plurality of alignment systems 58 are provided so as to detect the marks at different locations on the reticle R. If the reference mark is caused to run in the imaging plane of the projection lens and the positional relation between the projection points of the two marks on the reticle, the error of the magnification can be detected. Accordingly, where such measurement is possible, the alignment system therefor and the reference mark cooperate with each other to provide the fluctuation measuring means of the present invention.

Or the system as disclosed in U.S. Pat. No. 4,629,313 wherein a photoelectric sensor with a slit is provided on an XY stage and the contrast of the projected image of the pattern of a reticle is detected by the photoelectric sensor to thereby find the actual position of the imaging plane of a projection lens is also effective as the fluctuation measuring means of the present invention.

Further, where that side of the projection lens which is adjacent to the reticle is a non-telecentric system, a system whereby the spacing between the reticle R and the projection lens is varied to effect regulation of the magnification is likewise effective as the regulating means of the present invention.

I claim:

1. A projection optical apparatus comprising:
   a projection optical system for projecting an image of an object onto a substrate;
   data collecting means for obtaining data regarding a factor which causes a variation in an optical characteristic of said projection optical system;
   adjusting means for adjusting a relation between said substrate and the image of said object relative to the variation in the optical characteristic of said projection optical system;
   means for determining an amount of adjustment by said adjusting means in accordance with a model formula using a predetermined parameter on the basis of said data obtained by said data collecting means;
   means for independently measuring the variation in the optical characteristic of said projection optical system; and
   means for correcting the parameter of said model formula on the basis of the result measured by said measuring means.

2. A projection optical apparatus according to claim 1, wherein said data collecting means includes means for measuring an amount of light energy passing through said projection optical system.

3. A projection optical apparatus according to claim 1, wherein said adjusting means adjusts magnification of said projection optical system.

4. A projection optical apparatus according to claim 1, wherein said adjusting means adjusts a focusing position of said projection optical system.

5. A projection optical apparatus comprising:
   means for supplying light energy for illuminating an object;
   optical means employing light energy supplied from the illuminated object to form an image of said object on a substrate, an optical characteristic of said optical means being varied by the light energy supplied thereto;
   means for monitoring the light energy supplied to said optical means and producing monitoring data during each of successive predetermined periods;
   means for determining the optical characteristic of said optical means at each period, said determining means determining said optical characteristic at the end of any one of said periods on the basis of the optical characteristic at the end of the preceding period and monitoring data corresponding to the preceding period; and
   means for adjusting a relation between said image and said substrate in response to said determining means.

6. A projection optical apparatus according to claim 5, wherein said monitoring means generates said monitoring data at the end of each period.

7. A projection optical apparatus according to claim 6, wherein said monitoring data represents an amount of light energy supplied to said optical means during the corresponding period.

8. A projection optical apparatus according to claim 7, wherein said supplying means includes means for supplying said light energy intermittently, and said monitoring data represents a duty ratio during said corresponding period.

9. A projection optical apparatus according to claim 6, wherein said supplying means includes means for supplying said light energy intermittently in intervals each longer than each predetermined period, and said monitoring data is binary data indicating presence or absence of the supplying of said light energy to said optical means.

10. A projection optical apparatus according to claim 6, wherein said determining means assumes in said one period that said light energy is not supplied to said optical means and estimates an optical property at the end of that period.

* * * * *